US009231132B2

(12) United States Patent
Masunaga et al.

(10) Patent No.: US 9,231,132 B2
(45) Date of Patent: Jan. 5, 2016

(54) PROCESS FOR MANUFACTURING SOLAR CELL EQUIPPED WITH ELECTRODE HAVING MESH STRUCTURE

(71) Applicant: Kabushiki Kaisha Toshiba, Minato-ku (JP)

(72) Inventors: Kumi Masunaga, Kawasaki (JP); Akira Fujimoto, Kawasaki (JP); Tsutomu Nakanishi, Tokyo (JP); Eishi Tsutsumi, Kawasaki (JP); Ryota Kitagawa, Tokyo (JP); Koji Asakawa, Kawasaki (JP); Hideyuki Nishizawa, Tokyo (JP)

(73) Assignee: KABUSHIKI KAISHA TOSHIBA, Minato-ku (JP)

(*) Notice: Subject to any disclaimer, the term of this patent is extended or adjusted under 35 U.S.C. 154(b) by 0 days.

(21) Appl. No.: 14/038,960

(22) Filed: Sep. 27, 2013

(65) Prior Publication Data

US 2014/0024165 A1 Jan. 23, 2014

Related U.S. Application Data

(60) Division of application No. 13/216,977, filed on Aug. 24, 2011, now abandoned, which is a continuation of application No. PCT/JP2009/071460, filed on Dec. 24, 2009.

(30) Foreign Application Priority Data

Mar. 18, 2009 (JP) ................................ 2009-066146

(51) Int. Cl.
*H01L 21/00* (2006.01)
*H01L 31/0236* (2006.01)
*H01L 31/0224* (2006.01)

(52) U.S. Cl.
CPC .... *H01L 31/0236* (2013.01); *H01L 31/022433* (2013.01); *Y02E 10/50* (2013.01)

(58) Field of Classification Search
CPC .................. H01L 31/022433; H01L 31/0236; Y02E 10/50
USPC ...................................................... 438/57, 72
See application file for complete search history.

(56) References Cited

U.S. PATENT DOCUMENTS 4,664,748 A 5/1987 Ueno et al.
4,927,770 A 5/1990 Swanson (Continued)

FOREIGN PATENT DOCUMENTS

EP 1850397 A1 10/2007
JP 61-108176 5/1986

(Continued)

OTHER PUBLICATIONS

Reilly et al., Surface-plasmon enhanced transparent electrodes in organic photovoltaics, Applied physics letter 92, 243304 (2008), Jun. 17, 2008.*

(Continued)

*Primary Examiner* — Duy T Nguyen
(74) *Attorney, Agent, or Firm* — Oblon, McClelland, Maier & Neustadt, L.L.P.

(57) ABSTRACT

A solar cell having on a light incident surface side an electrode with both low resistivity and high transparency to promote efficient excitation of carriers using inexpensive materials. The solar cell includes a photoelectric conversion layer, a first electrode layer arranged on the light incident surface side, and a second electrode layer arranged opposed to the first electrode layer. The first electrode layer has a thickness in the range of 10 to 200 nm, and plural penetrating openings, each of which occupies an area in the range of 80 $nm^2$ to 0.8 $\mu m^2$, and has an aperture ratio in the range 10 to 66%. The first electrode layer can be produced by etching using an etching mask in the form of a single particle layer of fine particles, or of a dot pattern formed by self-assembly of a block copolymer, or of a stamper.

7 Claims, 9 Drawing Sheets

(56) References Cited

U.S. PATENT DOCUMENTS

| | | | | |
|---|---|---|---|---|
| 5,973,316 | A | 10/1999 | Ebbesen et al. | |
| 6,040,936 | A | 3/2000 | Kim et al. | |
| 6,423,567 | B1 | 7/2002 | Ludemann et al. | |
| 6,441,298 | B1 | 8/2002 | Thio | |
| 2005/0167865 | A1* | 8/2005 | Mizushima et al. | 264/1.33 |
| 2006/0279842 | A1* | 12/2006 | Kim et al. | 359/487 |
| 2007/0241077 | A1* | 10/2007 | Kochi et al. | 216/6 |
| 2008/0047600 | A1 | 2/2008 | Ohashi et al. | |
| 2008/0078982 | A1* | 4/2008 | Min et al. | 257/3 |
| 2008/0090318 | A1 | 4/2008 | Fattal et al. | |
| 2008/0099793 | A1 | 5/2008 | Fattal et al. | |
| 2009/0079322 | A1 | 3/2009 | Tsutsumi et al. | |
| 2009/0211783 | A1 | 8/2009 | Tsutsumi et al. | |
| 2010/0175749 | A1 | 7/2010 | Tsutsumi et al. | |
| 2010/0236619 | A1 | 9/2010 | Tsutsumi et al. | |
| 2010/0236620 | A1 | 9/2010 | Nakanishi et al. | |
| 2011/0220976 | A1 | 9/2011 | Iida et al. | |

FOREIGN PATENT DOCUMENTS

| | | | |
|---|---|---|---|
| JP | 8-191152 | | 7/1996 |
| JP | 2593063 | B2 | 12/1996 |
| JP | 9-172196 | | 6/1997 |
| JP | 2000-101114 | | 4/2000 |
| JP | 2002-76410 | | 3/2002 |
| JP | 2002-513212 | | 5/2002 |
| JP | 2003-160883 | | 6/2003 |
| JP | 3726887 | B2 | 12/2005 |
| JP | 2006-66550 | | 3/2006 |

OTHER PUBLICATIONS

Office Action issued Aug. 2, 2013 in Japanese Patent Application No. 2009-066146 (with English-language translation).

International Search Report mailed Mar. 9, 2010 in PCT/JP2009/071460 filed Dec. 24, 2009.

Thomas H. Reilly III et al., "Surface-plasmon enhanced transparent electrodes in organic photovoltaics", Applied Physics Letters, Jun. 17, 2008, vol. 92, No. 24, 3 pages.

Carsten Rockstuhl et al., "Absorption enhancement in solar cells by localized plasmon polaritons", Journal of Applied Physics, Dec. 17, 2008, vol. 104, No. 12, 7 pages.

Juris Prikulis et al., "Optical Spectroscopy of Nanometric Holes in Thin Gold Films", Nano Letters, Jun. 2004, vol. 4, No. 6, pp. 1003-1007.

R. A. Sinton et al. "Large-Area 21% Efficient Si Solar Cells", Conference Record $23^{RD}$ Photovoltaic Specialists Conference, 1993, p. 157-161.

English translation of the International Preliminary Report on Patentability issued Oct. 27, 2011, in PCT/JP2009/071460.

English translation of the Written Opinion of the International Searching Authority issued Mar. 9, 2010, in PCT/JP2009/071460.

Office Action issued Oct. 12, 2012 in Japanese Patent Application No. 2009-066146 (w/English translation).

HyperPhysics, "P-N Junction", created online on May 25, 2000, http://hyperphysics.phy-astr.gsu.edu/hbase/solids/pnjun.html.

* cited by examiner (a) solar cell equipped with normal comb-shaped metal electrode incident light hv n  p electrons excited by solar light $E_F$ n   p holes (b) solar cell according to the present invention incident light hv n  p electrons excited by solar light enhanced electric field $E_F$ n   p holes Opening diameter: 140 nm Period (distance between adjacent openings): 200 nm

PROCESS FOR MANUFACTURING SOLAR CELL EQUIPPED WITH ELECTRODE HAVING MESH STRUCTURE

CROSS REFERENCE TO RELATED APPLICATIONS

This application is a division of and claims the benefit of priority under 35 U.S.C. §120 from U.S. Ser. No. 13/216,977 filed Aug. 24, 2011, and claims the benefit of priority under U.S.C. §119 from Japanese Patent Application No. 2009-066146 filed Mar. 18, 2009, the entire contents of each of which are incorporated herein by reference.

FIELD

The present embodiment relates to a solar cell equipped with an electrode having mesh structure, and also to a process for manufacturing the same.

BACKGROUND

Solar cells directly convert inexhaustible and clean pollution-free solar energy into electrical energy, and hence they can be said to be important key devices in view of the environmental and energy exhaustion problems.

In general, a solar cell comprises a light incident surface side electrode arranged on the side where solar light enters, a counter electrode, and a semiconductor photoelectric conversion layer sandwiched between the electrodes. The photoelectric conversion layer now industrially produced is commonly made of silicon (Si), and the solar cell using Si normally includes a PN or PIN junction of monocrystalline Si, polycrystalline Si or amorphous Si (hereinafter, often referred to as "a-Si"). Besides that, there are also practical solar cells using compound semiconductors such as GaAs and chalcopyrite. The light incident-side electrodes adopted in many solar cells are comb-shaped metal electrodes, which are called "finger electrodes". However, solar cells using semiconductors having large surface resistivity, such as solar cells of a-Si type, are often equipped with not finger electrodes but transparent electroconductive films as the light incident-side electrodes.

At present, the largest problem of solar cells is to increase the photoelectric conversion efficiency. The photoelectric conversion efficiency of solar cells is generally in the range of about 10 to 15%. In order to increase the conversion efficiency, various improvements have been hitherto made. Those improvements are, for example, in that an antireflection film is formed and/or the light receiving surface is made to have a texture structure so as to reduce the reflection loss and in that a getter layer or a surface passivation film is provided so as to prevent the carrier recombination in the bulk or on the surface. Further, the improvements particularly for enhancing the light-receiving efficiency are, for example, in that the semiconductor layer is thickened and/or made of materials having large light-absorption coefficients and in that the effective incident area is enlarged by adopting an embedded electrode or a back electrode type solar cell.

It is also studied to improve the electrode structure for the sake of increasing the light transmittance and/or the conversion efficiency.

Those prior improvements, which, for example, aim at enlarging the effective incident area, are mainly for the purpose of increasing the light transmittance, and hence they by no means increase the conversion efficiency of the absorbed solar light for carrier excitation. The conversion efficiency, therefore, is not significantly improved.

DETAILED DESCRIPTION

Embodiments will now be explained with reference to the accompanying drawings.

One embodiment resides in a solar cell comprising a photoelectric conversion layer containing at least a p-type semiconductor and an n-type semiconductor, a first electrode layer made of metal and formed on the light incident side surface of said photoelectric conversion layer, and a second electrode layer formed on the surface opposite to said light incident side surface; wherein said first electrode layer has a thickness in the range of 10 nm to 200 nm, said first electrode layer has plural penetrating openings each of which occupies an area in the range of 80 $nm^2$ to 0.8 $\mu m^2$, and the aperture ratio, which is a ratio of the total area of said openings based on the total area of said first electrode layer, is in the range of 10% to 66%.

Figure 1:
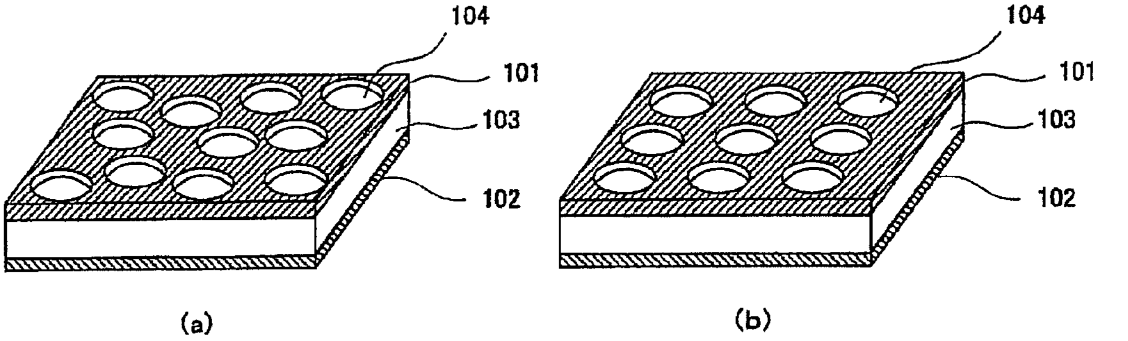
FIG. 1 shows conceptual sketches of solar cells according to one embodiment of the present invention.

First, the working principle of the embodiment is described in detail. FIG. 1 illustrates structures of solar cells according to one embodiment of the present invention. Each solar cell in FIG. 1 has a structure comprising a first electrode 101 arranged on the light incident surface side, a second electrode 102 arranged opposite to the first electrode, and a photoelectric conversion layer 103 sandwiched between the electrodes. As the photo-electric conversion layer usable for the solar cell, various types of semiconductor layers are known and any of them can be selected to use. Examples of them include pn-junction type, pin type and tandem structure type layers made of monocrystalline Si, polycrystalline Si, amorphous Si, compound semiconductors such as GaAs, and chalcopyrite-type semiconductors. The solar cell according to one embodiment of the present invention is partly characterized in that the first electrode 101 formed on the light-receiving surface is a thin metal film having openings 104 in a mesh structure. There is no particular restriction on the arrangement of the openings, and the openings may be positioned either randomly as shown in FIG. 1(*a*) or regularly as shown in FIG. 1(*b*).

Figure 2:
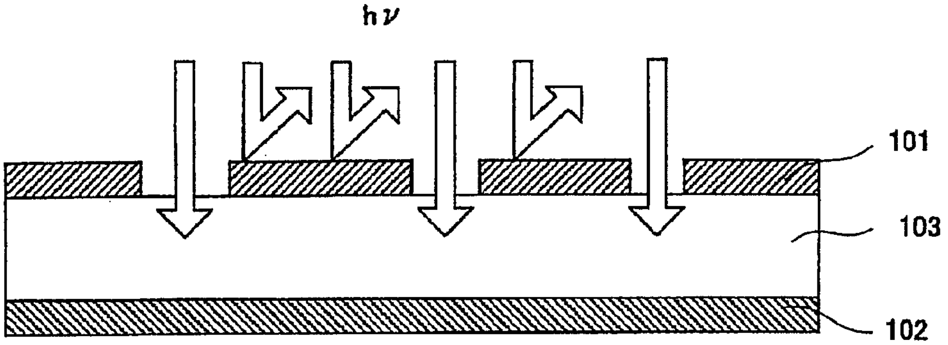
FIG. 2 is a schematic sectional view of a solar cell according to one embodiment of the present invention.

FIG. 2 schematically shows a vertical sectional view of the solar cell shown in FIG. 1. As illustrated in FIG. 2, since the first electrode 101 is made of metal, the photoelectric conversion layer in the areas covered with the metal does not transmit light and the light coming to those areas is reflected. Consequently, the light penetrates only through the openings and reaches the photoelectric conversion layer in the areas not covered. This means that the photoelectric conversion layer generally receives light in an amount corresponding to the area ratio of the openings based on the whole electrode surface. The photoelectric conversion layer is therefore generally thought to generate electric current in proportion to the amount of the received light.

Surprisingly, however, the present inventors have actually found that the first electrode having a particular structure enables to increase the electric current more than expected from the amount of light received by the photoelectric conversion layer.

Figure 3:
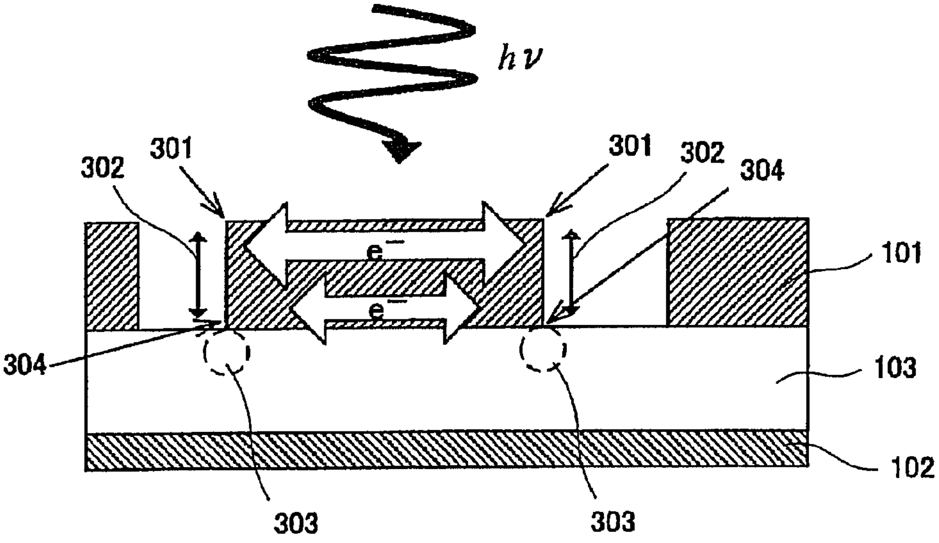
FIG. 3 is a schematic sectional view illustrating the working principle of a solar cell according to one embodiment of the present invention.
Figure 4:
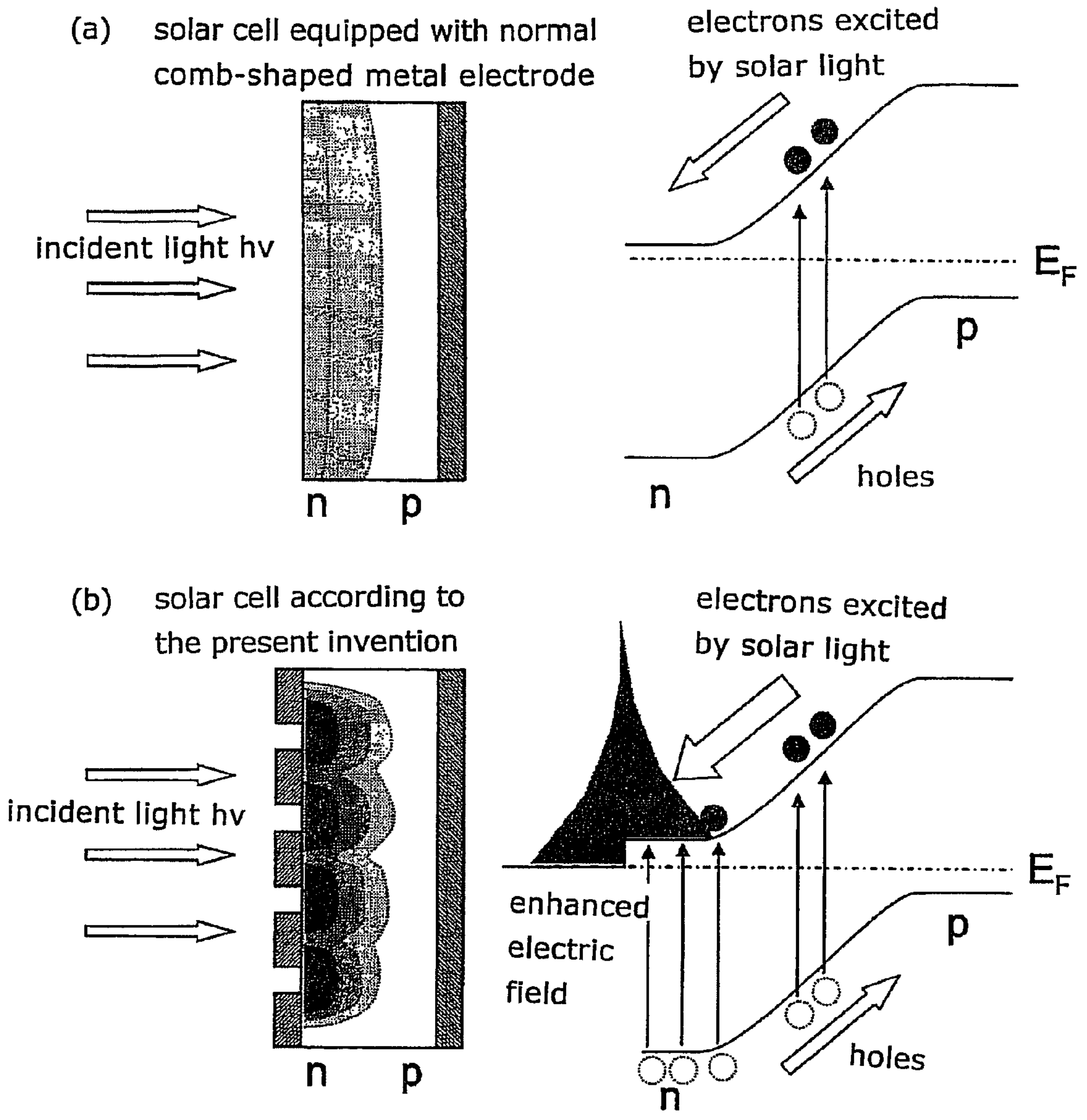
FIG. 4 shows conceptual drawings illustrating the working principle of a solar cell according to one embodiment of the present invention.

This phenomenon can be presumed to be caused by the following mechanism. It is already known that, when a thin metal film having fine openings is exposed to light, surface plasmons are excited under the condition that the openings have diameters corresponding to the wavelength of the incident light. FIG. 3 shows a conceptual drawing illustrating behavior of the plasmons. When a thin metal film receives light, free electrons in the film are induced to oscillate perpendicularly to the light propagation direction. However, the oscillation of free electrons is not uniform in the thickness direction. The nearer to the surface irradiated with the light the free electrons are positioned, the more easily they are oscillated. Accordingly, in the thin metal film, the electron density on the upper side 301 differs from that on the lower side 304 at the edges, so that alternating electric fields 302 oscillating along the thickness are generated at the edges. As a result, those electric fields extend into the photoelectric conversion layer, so that the electric field as a whole is enhanced at areas 303 right under the peripheries of the openings. The electric field-enhancement effect thus given by the particular electrode is explained below by referring to FIG. 4 in comparison with a case where a conventional electrode is used. FIG. 4(*a*) conceptually illustrates an electric field and electron-hole separation caused thereby in a solar cell comprising a conventional electrode such as a comb-shaped electrode. In the solar cell equipped with a conventional electrode, an electric field is generated by incident light coming onto the light incident surface but it becomes weaker according to the depth from the light incident surface. On the other hand, FIG. 4(*b*) illustrates an electric field in a solar cell according to the embodiment. As described above, the electric field is enhanced at edges of the thin metal film and hence extends deeply into the photoelectric conversion layer. It is thought that this enhanced electric field prevents recombination of carriers to improve the photoelectric conversion efficiency.

The solar cell according to one embodiment of the present invention comprises a mesh metal electrode as the first electrode layer on the light incident surface side, so that light penetrating through the openings can be photoelectrically converted and also so that the electric field can be enhanced near the edges of the fine openings. In this way, a great amount of carriers are presumed to be excited to increase the power generation efficiency. In other words, according to one embodiment of the present invention, the photoelectric conversion is also promoted even by light coming to the metal part of the first electrode, namely, even by light not reaching the photoelectric conversion layer.

Figure 5:
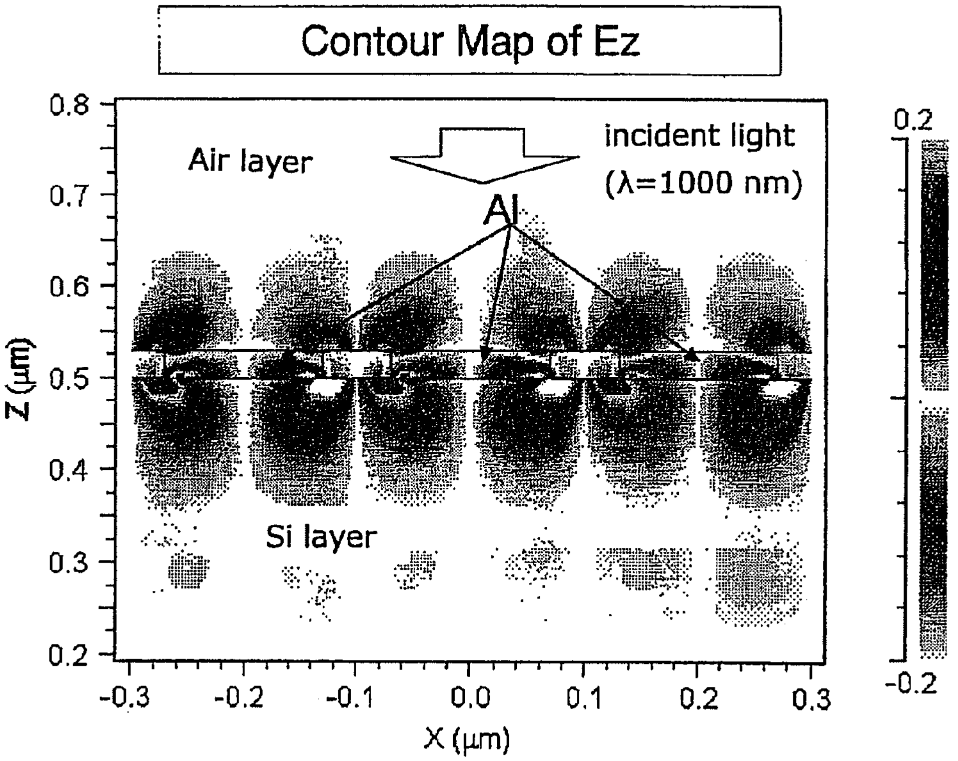
FIG. 5 shows simulation results of the electric field-enhancement effect in a solar cell.
Figure 6:
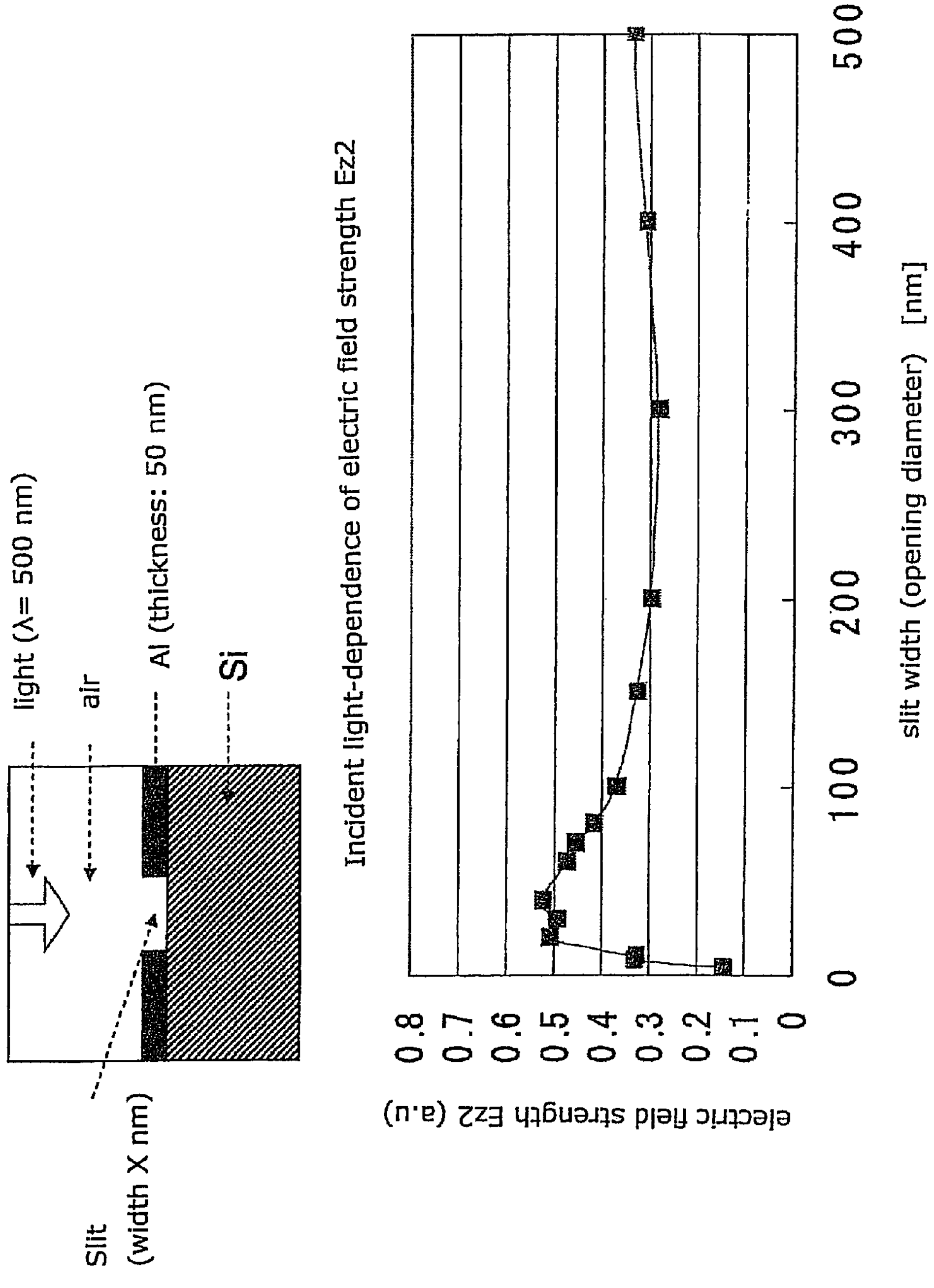
FIG. 6 shows simulation results of the electric field-enhancement effect in a solar cell.

With respect to a solar cell according to one embodiment of the present invention, the electric field strength was estimated on the basis of a simulation performed by use of the finite difference time domain method (hereinafter, referred to as "FDTD method"). The simulation was carried out under the assumptions that the photoelectric conversion layer was made of Si and that the first electrode was a 30 nm-thick aluminum film provided with openings (opening diameter: 140 nm, period (interval between centers of adjacent openings): 200 nm). The results were shown in FIG. 5, which verified that enhanced electric fields were generated at the edges of the first electrode. Further, FIG. 6 shows the results of another simulation performed under the assumption that 500 nm-light, which is included in the solar light spectrum, was applied in air onto the first electrode side of a solar cell comprising a Si photoelectric conversion layer and a 50 nm-thick aluminum first electrode provided with periodically arranged openings. The results indicate that the z-component of the electric field is constant if the opening size (slit width) is more than a certain value but that the electric field is enhanced at the edges of the surface electrode if the openings have a particular size.

Figure 7:
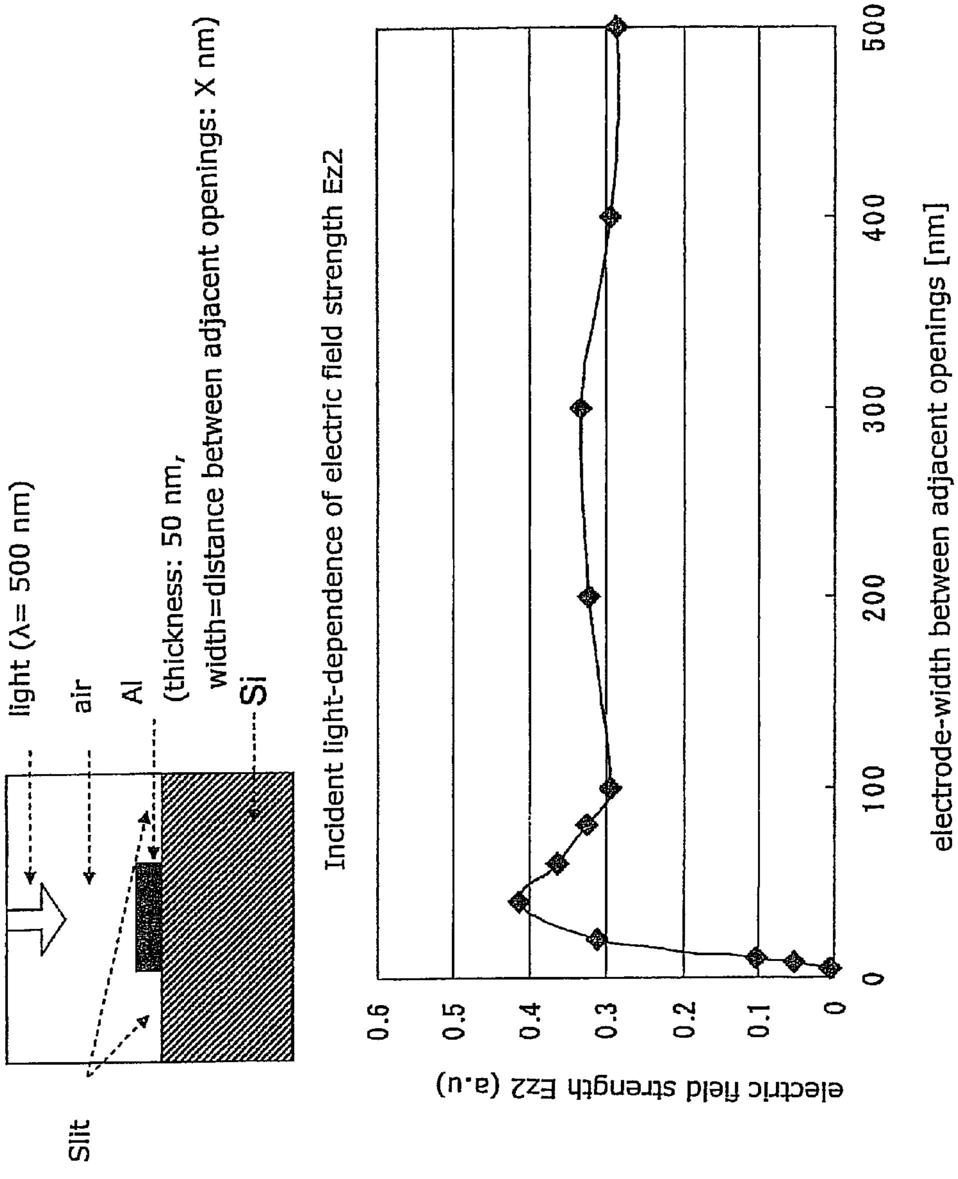
FIG. 7 shows simulation results of the electric field-enhancement effect in a solar cell.

Further, still another simulation was carried out to estimate how the distance between two adjacent openings, namely, the length of the minimum metal first electrode part between two adjacent openings (hereinafter referred to as "electrode-width between adjacent openings"), is related to the strength of local electric fields at the edges of the electrode. The results are shown in FIG. 7, which indicates that the electric field strength has a peak in a particular range of the distance between two adjacent openings. That is because, if the electrode-width between adjacent openings is less than 10 nm on average, alternating electric fields appearing along the thickness at both ends of each electrode part are cancelled out by each other and hence are incapable of enhancing the electric field. On the other hand, if the electrode-width between adjacent openings is more than 200 nm on average, the above alternating electric fields do not interact with each other and hence the electric field has constant strength. Further, in order that the electrode may have sufficient electroconductivity, the electrode-width between adjacent openings needs to be 10 nm or more.

Accordingly, in the first electrode proposed by the embodiment, the length of the minimum metal electrode part between two adjacent openings is preferably from 10 nm to 200 nm, more preferably from 30 nm to 100 nm, on average.

In order that light may penetrate though the first electrode, it is advantageous for the openings to occupy large areas in the first electrode. On the other hand, however, for the purpose of keeping high electroconductivity, the openings preferably occupy small areas. Form those viewpoints, the ratio of the total area of the openings based on that of the first electrode layer, namely, the aperture ratio, is necessarily in the range of 10% to 66%, preferably in the range of 25% to 66%.

Under the condition that the distance between adjacent openings is within the above range, the total length of the edges, namely, the total peripheral length of the openings is preferably long enough to further enhance the electric field per unit area. Specifically, if the openings are in the form of circles having predetermined diameters and are periodically placed, the number of the openings can be increased and accordingly the total peripheral length can be extended by shorting the distance between adjacent openings, so as to strengthen the electric field-enhancement effect. On the other hand, if the openings are in the form of circles and are placed so periodically that the electrode-width between adjacent openings may have a predetermined length, the number of the openings can be increased and accordingly the total peripheral length can be extended by reducing the opening diameters, so as to strengthen the electric field-enhancement effect.

The openings are, however, not necessarily placed periodically, and may be positioned in any arrangement such as periodical, pseudo-periodical or random arrangement. Since the openings in any arrangement can give the effect of the embodiment, there is no particular restriction on how periodically the openings are arranged. The shapes of the openings are also not restricted to circles. In view of the electric field-enhancement effect, star-shaped or figure-C-shaped openings are advantageous rather than circular ones because the total peripheral length of those openings is longer than that of circular openings. On the other hand, however, circular openings have the advantage of easily producing the electrode.

As described above, the electric field-enhancement effect depends both on the distance between adjacent openings and on the shapes of openings. However, the results of the simulations according to the FDTD method indicate that each individual opening occupies necessarily an area in the range of 80 $nm^2$ to 0.8 $\mu m^2$, preferably an area in the range of 1000 $nm^2$ to 0.03 $\mu m^2$. If the openings are circles in shape, the opening diameter (diameter of opening) is preferably in the range of 10 nm to 1000 nm, more preferably in the range of 40 nm to 200 nm.

Further, the first electrode layer needs to have a thickness of 10 nm to 200 nm. If the thickness is less than 10 nm, the metal layer has too high a resistivity to keep sufficient electroconductivity and accordingly the photoelectric conversion efficiency is lowered. It is, therefore, unfavorable. On the other hand, if the thickness is more than 200 nm, the photoelectric conversion layer is often incapable of benefiting from the electric field-enhancement effect sufficiently to improve the conversion efficiency. It is, therefore, also unfavorable.

As described above, the particular structure of the first electrode enhances the electric field at the edges of the first electrode (namely, at the peripheral areas of the openings). This electric field-enhancement effect works on a semiconductor layer and a depletion layer in the photoelectric conversion layer, so as to improve the photoelectric conversion efficiency. The depletion layer is, therefore, necessarily placed within a short distance from the first electrode. Accordingly, the depletion layer is at least partly positioned within a distance of preferably 1 μm or less, more preferably 500 nm or less from the interface between the first electrode and the photoelectric conversion layer.

In the above description, the solar cell according to one embodiment of the present invention is explained from the viewpoint of the structure. The structure of the solar cell can be made of any materials freely selected from conventionally known ones.

The first electrode on the light incident surface side in the embodiment can be made of any known metal, which can be freely selected to use. Here, the "metal" means a material which is an electroconductive simple substance, which has metallic gloss, which has malleability, which consists of metal atoms and which is solid in room temperature; or an alloy thereof. In the embodiment, the electric field-enhancement effect is caused when the electromagnetic wave penetrates into the metal electrode, and hence the metal electrode in the embodiment is preferably made of a material in which electrons can oscillate in accordance with oscillation of the incident light electric field. This means that the material in the form of a bulk body having a flat surface preferably reflects light in the wavelength range of solar light. Further, the material preferably less absorbs light in the wavelength range intended to be used. Examples of the material include aluminum, silver, gold, platinum, nickel, cobalt, chromium, copper, and titanium. Among them, preferred are aluminum, silver, platinum, nickel and cobalt. However, these examples by no means restrict the material as long as the material is a metal having a lower plasma frequency than the incident light. It is, therefore, unnecessary to use rare metals such as indium and hence typical metal materials are usable in the embodiment.

In a solar cell most popularly used at present, the photoelectric conversion layer comprises p-type semiconductor and n-type semiconductor. Accordingly, the conversion layer preferably comprises p-type and n-type semiconductors so that it can be produced easily at low cost. In view of availability, the semiconductor is preferably silicon such as monocrystalline silicon, polycrystalline silicon or amorphous silicon. For example, layers of p-type crystal silicon and n-type crystal silicon are laminated to form a pn-junction type photoelectric conversion layer. The p-type/n-type crystal silicon may be in any form such as single crystal, poly-crystal, fine crystallite or amorphous solid. However, the single crystal silicon has the advantage of high photoelectric conversion efficiency, while the poly-crystal silicon has the advantage of low production cost. Further, it is also possible to use a pin-junction type photoelectric conversion layer in which layers of p-type amorphous silicon, i-type undoped amorphous silicon and n-type amorphous silicon are laminated in order. This photoelectric conversion layer has the advantages that it can be produced at low cost and that the output power is hardly lowered even at a high temperature.

The material of the photoelectric conversion layer is not restricted to silicon, and may be a III-V group compound semiconductor such as GaAs, a II-VI group compound semiconductor or a chalcopyrite-type compound semiconductor. The structure of the conversion layer is also not restricted to the laminate type described above, and may be a hetero-junction type, a fine particle type, a tandem type, a dot type or a junction type. In the embodiment, there is no particular restriction on the structure of the photoelectric conversion layer.

The second electrode opposite to the first one may be made of any material as long as it can have an ohmic contact with the contiguous semiconductor. For example, materials usable for the first electrode are also usable for the second one.

Meanwhile, there are various studies for increasing the photoelectric conversion efficiency of the solar cell. For example, it has been studied to improve an antireflection layer or to modify the bottom structure of the photoelectric conversion layer. Those techniques can be combined with the solar cell according to one embodiment of the present invention unless they impair the effect of the embodiment.

As another embodiment of the present invention, the process for producing the solar cell is described below.

The solar cell produced in the embodiment comprises a photoelectric conversion layer, a first electrode layer formed on the photoelectric conversion layer, and a second electrode layer formed on the opposite surface. There is no particular restriction on the order of forming those layers, which may be formed by either of:

(1) a method in which the photoelectric conversion layer is formed, and then the first electrode is formed on one surface thereof, and finally the second electrode is formed on the other surface; and (2) a method in which semiconductor is accumulated on the first electrode or on the second electrode to form the photoelectric conversion layer, and then the second electrode or the first electrode, respectively, is formed thereon.

The photoelectric conversion layer can be formed by any method according to the semiconductor intended to be used. For example, a substrate of p-type or n-type semiconductor is partly doped with impurities, or otherwise another semi-conductor layer is formed on the substrate by vapor-deposition. Further, the photoelectric conversion layer can be also obtained by the steps of forming an electrode layer on a transparent substrate by, for example, vapor deposition, and then laminating a p-type, n-type or i-type semiconductor layer thereon.

The solar cell according to an embodiment of the present invention is characterized by the first electrode having openings. The structure of the first electrode can be formed by the steps of: first forming a thin metal layer on a surface of the conversion layer, and then boring the openings. In a different way, a thin metal film beforehand provided with openings may be laminated on the photoelectric conversion layer.

For forming fine openings on the first electrode, any method can be selected to use. For example, in a generally known method, an etching procedure is carried out by use of an electron beam exposure system capable of forming a super-fine structure. However, if this method is adopted, there is a fear that the production cost increases. In contrast, the fine openings can be formed at low cost according to the following methods:

(A) a method comprising the steps of:

coating a resist on a thin metal film intended to be an electrode, to form a resist layer;

forming a single particle layer of fine particles on the resist layer, etching the resist layer by use of the single particle layer as an etching mask, to form a resist pattern having openings corresponding to the aimed fine openings, filling the openings in the resist pattern with inorganic substance, to form a reverse pattern mask, and etching the thin metal film by use of the reverse pattern mask, to form fine openings;

(B) a method comprising the steps of:

coating a block copolymer-containing composition on a thin metal film intended to be an electrode, to form a block copolymer layer, forming microdomains of the block copolymer in a dot pattern, and etching the thin metal film by use of the dot pattern of the formed microdomains, to form fine openings; and (C) a method comprising the steps of:

preparing a stamper whose surface has a fine relief pattern corresponding to the shape of the first electrode intended to be formed, transferring a resist pattern onto a thin metal film intended to be an electrode by use of the stamper, and forming the pattern on the thin metal film by use of the resist pattern.

Further, the first electrode can be also produced by another process in which a pattern of resist or of inorganic substance is directly formed on the photoelectric conversion layer before the thin metal layer is formed, and then metal is accumulated on spaces in the pattern by vapor deposition and the like.

The embodiment is further explained by the following examples, which by no means restrict the embodiment.

Example 1

Solar Cell Using Monocrystalline Si

The manufacturing process and characteristics of a monocrystalline Si type solar cell are explained in the following example by referring to FIG. 8.

[Production Procedure of Photoelectric Conversion Layer]

First, the procedure for producing a photoelectric conversion layer of monocrystalline Si is described below.

Figure 8:
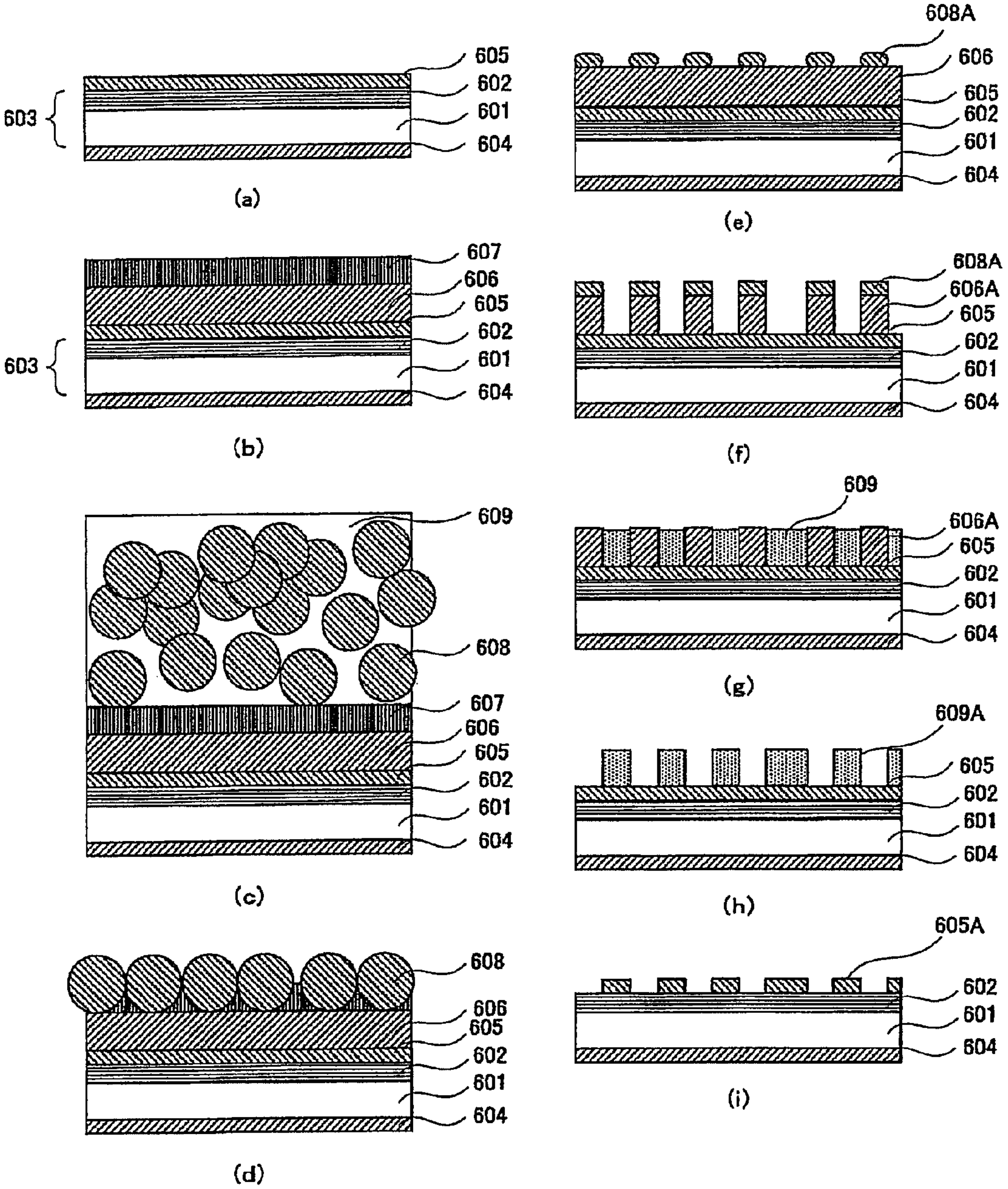
FIG. 8 shows schematic sectional views illustrating a process for manufacturing a solar cell according to one embodiment of the present invention.

As shown in FIG. 8(*a*), a p-type silicon substrate 601 of monocrystalline Si is prepared as a semiconductor substrate. In Example 1, an ingot of silicon doped with boron as an impurity was obtained according to the Czochralski pulling method, and then sliced with a multi-wire saw to prepare a p-type silicon substrate 601 of monocrystalline Si having a thickness of 540 μm and a specific resistance of about 8 Ω·cm. The silicon substrate 601 was then thinned down to 380 μm by mechanical polishing. In the embodiment, the semiconductor substrate may be made of polycrystalline Si and the silicon may be doped with generally known impurities other than boron.

Thereafter, an $n^+$ layer 602 containing many n-type impurity elements such as phosphorus is formed on one of the major faces of the p-type semiconductor substrate 601. The $n^+$ layer 602 can be formed by a thermal diffusion method in which the semiconductor substrate 601 is placed in a high temperature gas containing phosphorus oxychloride ($POCl_3$) so that n-type impurity elements such as phosphorus can be diffused into one of the major faces of the substrate 601. As the result of the thermal diffusion method, the $n^+$ layer 602 may be formed on both faces and ends of the p-type semiconductor substrate 601. In that case, in order to remove the $n^+$ layer 602 formed on the unwanted surface, the p-type semiconductor substrate 601 may be immersed in a fluoro-nitric acid solution after the layer 602 formed on the aimed surface is covered with an acid-resistant resin. In Example 1, the $n^+$ layer 602 was formed by a thermal diffusion method in which the semiconductor substrate 601 was placed in $POCl_3$ atmosphere at 1100° C. for 15 minutes. The formed $n^+$ layer 602 had a sheet resistivity of about 50 Ω/square.

Subsequently, the $n^+$ layer 602 on the aimed face was covered with an acid-resistant resin, and then the p-type semiconductor substrate 601 was immersed in a fluoro-nitric acid solution for 15 seconds to remove the $n^+$ layer 602 not covered with the resin. After that, the acid-resistant resin was removed to obtain the $n^+$ layer 602 on only one of the major faces of the p-type semiconductor substrate 601. The resultant $n^+$ layer 602 had a thickness of 500 nm.

Although the $n^+$ layer was thus formed on the p-type semiconductor substrate 601 in the present example, any other processes may be used to form a pn junction.

On the other surface of the p-type semiconductor substrate 601, Au/Zn was vapor-deposited in vacuum to form a second electrode layer 604. This second electrode layer 604 of Au/Zn functions not only as a second electrode but also as an anti-reflection layer Thereafter, a first electrode 605A having fine openings is formed on the sunlight-incident side surface of the $n^+$ layer 602.

[Production of First Electrode having Mesh Structure]

As the first electrode having fine openings, an aluminum electrode having mesh structure was formed on the $n^+$ layer 602. The present inventors have developed a process comprising the steps of: forming a single particle layer in which fine particles are aligned in a closest packing arrangement on a substrate; and shaving the aligned nano-particles by etching to a desired size, so as to form a dot pattern. The formed dot pattern is transferred onto a thin metal layer 605, which can be used as the first electrode 605A having fine openings. This method for forming a first electrode is described below in detail.

First, on a major face of the $n^+$ layer provided on the silicon substrate, aluminum was vapor-deposited in vacuum to form a thin metal layer 605 of 50 nm thickness (FIG. 8(*a*)).

Independently, an i-line positive thermosetting resist (THMR IP3250 [trademark], manufactured by Tokyo Ohka Kogyou Co., Ltd.) was diluted with ethyl lactate by 1:1. After filtrated through 0.2 μm-mesh filter, the solution was spin-coated on the thin metal layer 605 at 2000 rpm for 60 seconds and then heated on a hot-plate at 110° C. for 90 seconds, and further heated at 270° C. for 1 hour in an oxidation-free inert oven under nitrogen gas-atmosphere to undergo a thermosetting reaction. The resist layer 606 thus formed had a thickness of approx. 240 nm.

The resist layer 606 was then subjected to reactive etching for 3 seconds under the conditions of $O_2$: 30 sccm, 100 mTorr and a RF power of 100 W by means of a reactive etching system (RIE-200L [trademark], manufactured by SAMCO Inc.), and thereby the surface was made hydrophilic (FIG. 8(*b*)). The hydrophilized surface functioned in the following step as a trap layer for catching fine silica particles. The trap layer may be formed, for example, by coating the resist layer with an organic polymer.

Subsequently, a dispersion solution of fine silica particles having a size of 200 nm (PL-13 [trademark], manufactured by Fuso Chemical Co., Ltd.) was diluted with an acryl polymer-containing composition to 5 wt %, and filtrated through a 1 μm-mesh filter to prepare a coating solution of fine silica particle dispersion 609. The solution was spin-coated at 2000 rpm for 60 seconds on the above resist-coated substrate (FIG. 8(*c*)), and then the substrate was annealed at 150° C. for 1 hour in an oxidation-free inert oven under nitrogen gas-atmosphere. Thereafter, the substrate was cooled to room temperature, and thereby a single particle layer of regularly arranged fine silica particles was formed on the hydrophilized resist layer (FIG. 8(*d*)). Although fine silica particles were adopted as the fine particles in the present example, any organic or inorganic fine particles can be used as long as they can be etched in a rate different from the resist layer, as described later. The size of the fine particles depends on the pattern of the first electrode, but is generally 60 to 700 nm.

The single particle layer of fine silica particles was subjected to etching for 2 minutes under the conditions of $CF_3$: 30 sccm, 10 mTorr and a RF power of 100 W (FIG. 8(*e*)), to reduce the size of the particles and accordingly to expand intervals among the particles. The etching conditions were so selected that the underlying resist layer might not undergo the etching. Since the particles and the resist layer are etched in different rates, it is possible to etch only the silica particles so as to form intervals among them. After the above procedure, the single particle layer was observed by electron microscopy to find that the size of the fine silica particles 608A and the intervals among them were about 120 nm and about 80 nm, respectively.

Thereafter, the remaining silica particles were used as a mask while the underlying thermosetting resist layer was subjected to etching for 270 seconds under the conditions of $O_2$: 30 sccm, 2 mTorr and a RF power of 100 W.

As a result, columnar structures of high aspect ratios were formed in the areas where the etched silica particles had been previously positioned, to obtain a columnar resist pattern 606A of high aspect ratios (FIG. 8(*f*)).

Independently, a spin-on-glass (hereinafter, referred to as SOG) solution (SOG-14000 [trademark], manufactured by Tokyo Ohka Kogyou Co., Ltd.) was filtrated through 0.3 μm-mesh filter. The SOG solution was then spin-coated at 2000 rpm for 40 seconds on the obtained columnar resist pattern, so that the intervals among the columns of the resist pattern were filled with SOG. After that, the substrate was heated on a hot-plate at 110° C. for 90 seconds and further heated at 250° C. for 1 hour in an oxidation-free inert oven under nitrogen gas-atmosphere.

Subsequently, the formed SOG layer and fine silica particles included therein were etched for 11 minutes under the conditions of $CF_3$: 30 sccm, 10 mTorr and a RF power of 100 W, and thereby the remaining silica particles and excess SOG covering the columnar resist pattern were removed to form a columnar resist pattern including SOG 609 filling the intervals among the columns 606A (FIG. 8(*g*)).

The remaining columns 606A of thermosetting resist were then etched for 150 seconds under the conditions of $O_2$: 30 sccm, 10 mTorr and a RF power of 100 W, so that a SOG mask 609A having a pattern structure in reverse to the above columnar resist pattern was formed on the metal thin layer 605 (FIG. 8(*h*)).

After that, the metal thin layer 605 was etched through the SOG mask 609A by means of ICP-RIE system (manufactured by SAMCO Inc.). In general, when an aluminum film is exposed to air, a few nonometer-thick $Al_2O_3$ layer is immediately formed thereon. Therefore, the metal thin layer 605 was first subjected to sputter-etching for 1 minute under the conditions of Ar: 25 sccm, 5 mTorr, an ICP power of 50 W and a Biass power of 150 W to remove $Al_2O_3$, and was then etched for 50 seconds under the conditions of $Cl_2$/Ar mixed gas: 2.5/25 sccm, 5 mTorr, an ICP power of 50 W and a Biass power of 150 W.

Thereafter, the remaining SOG mask 609A was removed by etching for 150 seconds by means of a reactive etching system under the conditions of $CF_3$: 30 sccm, 10 mTorr and a RF power of 100 W (FIG. 8(*i*)).

[Shape of First Electrode having Mesh Structure]

The above procedure gave a 50 nm-thick surface electrode 605A on the aforementioned $n^+$ layer. The electrode 605A had a mesh structure provided with openings having an average opening area of $9.8\times10^{-3}$ $\mu m^2$ (opening diameter: 112 nm) and an average aperture ratio of 28.4%. The transmittance of the produced first electrode was measured at an incident light wavelength of 500 nm, and found to be about 39%. The resistivity thereof was also found to be about 107.3 Ω·cm.

[Characteristics of First Electrode having Mesh Structure]

The solar cell produced above in Example 1 was exposed to simulated solar light of AM1.5, to evaluate the photoelectric conversion efficiency at room temperature. As a result, the efficiency was found to be as high as 6.1%. Further, it was also verified that the effect of the embodiment was obtained even if the first electrode was made of metals other than aluminum.

Comparative Example 1

In the same manner as in Example 1, a comparative solar cell was produced. The comparative solar cell was equipped with a first electrode whose thickness and average aperture ratio were the same as those of the first electrode in Example 1 but whose openings had an average diameter of 2 μm (average opening area: 3.1 $\mu m^2$), namely, about twenty times as large an average diameter as those in the first electrode in Example 1. Since having large diameters, the openings were made by use of photolithographic technology. The produced solar cell was evaluated in the same manner as in Example 1, and was found to have a photoelectric conversion efficiency of 3.6%.

Example 2

Solar Cell Using Polycrystalline Si

Example 2 explains the manufacturing process of a polycrystalline Si type solar cell. The process for a polycrystalline Si type solar cell is similar to that for a monocrystalline Si type one described above in Example 1.

First, an ingot of silicon material was sliced with a multi-wire saw to prepare a 400 μm-thick p-type semiconductor substrate of polycrystalline Si. Since mechanically damaged in the slicing procedure, the substrate surface was washed by etching with NaOH. The substrate was then placed in a diffusion furnace and heated under oxychloride ($POCl_3$) atmosphere at 1100° C. for 30 minutes, so that phosphorus atoms were diffused into the surface of the semiconductor substrate to form an n-type semiconductor area having a sheet resistivity of 60 Ω/square. Thus, a pn-junction was formed in the wafer.

Thereafter, the whole back surface of the substrate was coated with aluminum paste and heated to form a $p^+$ layer and a second electrode. Subsequently, on the light incident side opposite to the second electrode, a first electrode having mesh structure of aluminum was formed in the same manner as in Example 1.

With respect to the polycrystalline Si type solar cell thus produced, the photoelectric conversion efficiency was evaluated in the same manner as in Example 1. As a result, the efficiency was found to be as high as 5.8%. Further, it was also verified that the effect of the embodiment was obtained even if the first electrode was made of metals other than aluminum.

Comparative Example 2

In the same manner as in Example 2, a comparative solar cell was produced. The comparative solar cell was equipped with a first electrode whose thickness and average aperture ratio were the same as those of the first electrode in Example 2 but whose openings had an average diameter of 2 μm (average opening area: 3.1 $\mu m^2$), namely, about twenty times as large an average diameter as those in the first electrode in Example 2. Since having large diameters, the openings were made by use of photolithographic technology. The produced solar cell was evaluated in the same manner as in Example 2, and was found to have a photoelectric conversion efficiency of 3.7%.

Example 3

Solar Cell Using Amorphous Si

Figure 9:
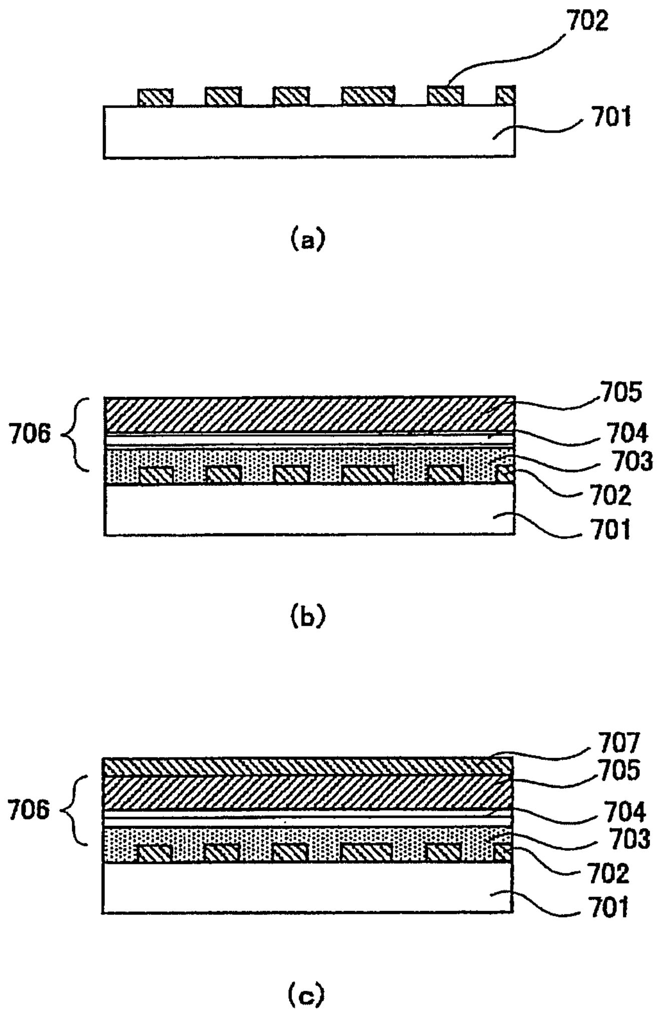
FIG. 9 shows schematic sectional views illustrating another process for manufacturing a solar cell according to one embodiment of the present invention.

The manufacturing process of an amorphous Si type solar cell is explained in this example by referring to FIG. 9.

In the first step, a 50 nm-thick thin metal layer of aluminum was vapor-deposited on a transparent quartz substrate 701 and then processed by use of fine particles in the same manner as in Example 1 to form a first electrode 702 having mesh structure of aluminum (FIG. 9(*a*)).

Subsequently, the transparent substrate 701 was treated in a plasma CVD apparatus, so that a p-layer 703 of p-type Si, an i-layer 704 of i-type Si and an n-layer 705 of n-type Si were successively formed and accumulated thereon in order from $PH_3/SiH_4$ mixed gas, $SiH_4$ gas and $B_2H_6/SiH_4$ mixed gas, respectively, to form a pin-type photoelectric conversion layer 706 (FIG. 9(*b*)). Independently, the procedure was repeated except for not forming the i-layer, to form a pn-type photoelectric conversion layer. Thereafter, a second electrode layer 707 was formed on the n-layer in each conversion layer by means of sputtering apparatus from a silver alloy containing aluminum (FIG. 9(*c*)).

With respect to the amorphous Si type solar cells thus produced, the photoelectric conversion efficiency was evaluated in the same manner as in Example 1. As a result, the efficiency was found to be as high as 4.6% in the pin-type and 5.8% in the pn-type. The reason why the pn-type layer gave a higher efficiency than the pin type one is thought to be because a depletion layer, in which carries were excited, in the pn-type layer was positioned nearer to the first electrode than in the pin type one.

Example 4

Solar Cell Using Chalcopyrite-Type Compound Semiconductor

This example explains the manufacturing process of a chalcopyrite-type compound semiconductor solar cell.

In the first step, a Mo electrode was formed on a substrate of soda-lime glass by vacuum vapor deposition to produce a lower electrode. The lower electrode may be made of metals other than molybdenum, for example, titanium and tungsten.

Subsequently, copper (Cu), indium (In) and gallium (Ga) were sputtered to form a layer called "precursor". The precursor was then annealed at 400 to 600° C. under hydrogen selenide ($H_2Se$) gas atmosphere in a furnace, and was thereby converted into a CIGS layer.

As for formation of the photoelectric conversion layer, some techniques are developed. For example, Cu, In, Ga and Se may be vapor-deposited to form a layer, and then annealed. Accordingly, the embodiment is not restricted to the above manner and any method can be adopted to form the photoelectric conversion layer.

Thereafter, a first electrode having fine openings was provided on the formed CIGS layer. The first electrode was formed in the same manner as in Example 1.

With respect to the chalcopyrite-type compound semiconductor solar cell thus manufactured, the photoelectric conversion efficiency was evaluated in the same manner as in Example 1. As a result, the efficiency was found to be as high as 7.3%.

Example 5

Solar Cell Using GaAs

This example explains a compound semiconductor type solar cell using GaAs.

According to the MOCVD (metal organic chemical vapor deposition) method, an $n^+$-type layer was epitaxially grown on a p-type GaAs wafer to produce a cell. Subsequently, a first electrode having fine openings and a second electrode were formed in the same manner as in Example 1. With respect to the thus-produced compound semiconductor type solar cell using GaAs, the photoelectric conversion efficiency was evaluated in the same manner as in Example 1. As a result, the efficiency was found to be as high as 6.3%.

Example 6

Manufacturing Process Using Block Copolymer

This example explains the manufacturing process of a monocrystalline Si type solar cell equipped with a first electrode having openings formed by use of phase-separation of block copolymer. The photoelectric conversion layer of mono-crystalline Si was formed in the same manner as in Example 1.

The present inventors have developed a method in which a pattern structure having dots arranged in a period of 50 to 70 nm is formed by use of phase-separation of block copolymer and then is used to form a first electrode having mesh structure. The method is described below.

Figure 10:
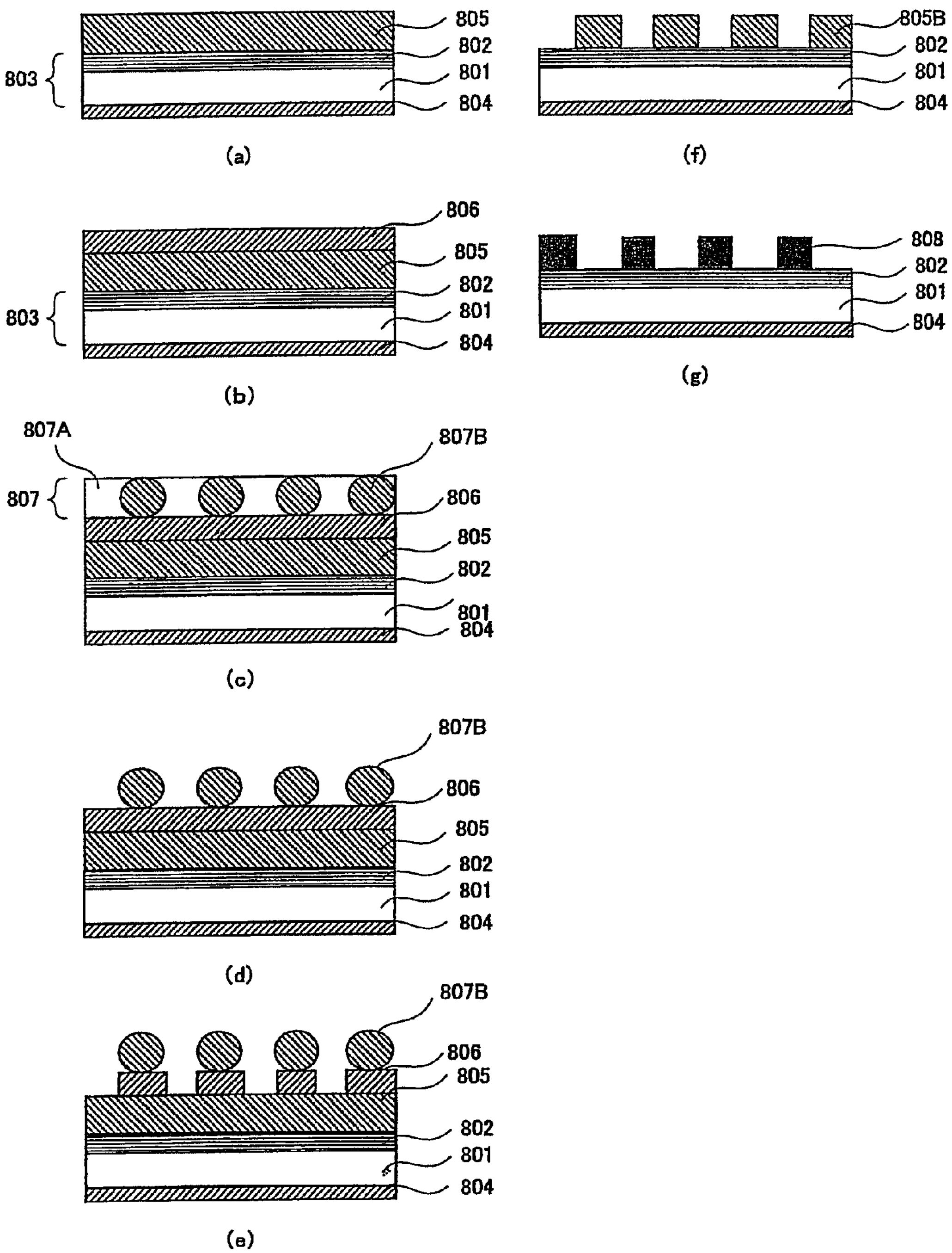
FIG. 10 shows schematic sectional views illustrating still another process for manufacturing a solar cell according to one embodiment of the present invention.

By referring to FIG. 10, the following description explains the manufacturing process of an electrode having aluminum-made nano-mesh structure formed according to the method using a block copolymer.

First, an $n^+$ layer 802 was formed on one surface of a p-type silicon substrate 801 in the same manner as in Example 1, to produce a photoelectric conversion layer 803. After that, Au/Zn was vapor-deposited in vacuum to form a second electrode layer 804 on the p-type layer.

Independently, an i-line positive thermosetting resist (THMR IP3250 [trademark], manufactured by Tokyo Ohka Kogyou Co., Ltd.) was diluted with ethyl lactate by 1:3, to prepare a resist composition. The resist composition was spin-coated on the $n^+$ layer of the photoelectric conversion layer 803 on the light-receiving side, and then heated at 250° C. for 1 hour in an oxidation-free inert oven under nitrogen gas-atmosphere to undergo thermosetting reaction and thereby to form a resist layer 805 (FIG. 10(*a*)).

Subsequently, an SOG (SOG-5500 [trademark], manufactured by Tokyo Ohka Kogyou Co., Ltd.) was diluted with ethyl lactate. The diluted SOG was spin-coated on the resist-coated substrate at 2000 rpm for 45 seconds, and then heated at 250° C. for 1 hour in an oxidation-free inert oven under nitrogen gas-atmosphere to form a SOG layer 806 (FIG. 10(*b*)).

Thereafter, a diblock copolymer of polystyrene (PS)-polymethyl methacrylate (PMMA) was mixed with PMMA (Mw: 1500) in an weight ratio of 6:4. The mixed polymer was dissolved in propylene glycol monomethyl ether acetate (PGMEA) in an amount of 3 wt %. The solution was spin-coated on the above substrate at 2000 rpm for 30 seconds, and then pre-baked at 110° C. for 90 seconds to evaporate the solvent and thereby to form a layer of 120 nm thickness.

The formed layer was then annealed at 210° C. for 4 hours under nitrogen gas-atmosphere, to cause phase separation between PS and PMMA and thereby to form a block copolymer layer 807. The diblock copolymer had molecular weights of 78000 g/mol at the PS part and 170000 g/mole at the PMMA part, and hence gave a morphology in which PS forms a dot pattern of microdomains 807B having diameters of about 50 to 90 nm in PMMA matrix 807A (FIG. 10(*c*)).

The block copolymer layer 807 was subjected to etching so as to selectively remove the PMMA matrix. The etching conditions were $O_2$: 30 sccm, 100 mTorr and a RF power of 100 W. In this step, the SOG layer in the area right under the matrix 807A was completely bared (FIG. 10(*d*)). After that, the SOG layer was then subjected to etching of $CF_4$-RIE by use of the remaining PS as a mask. As a result of this etching procedure, the dot pattern of PS is transferred onto the SOG layer to form a SOG pattern corresponding to the phase separation of block copolymer (FIG. 10(*e*)). Subsequently, the underlying thermosetting resist layer was subjected to etching of $O_2$-RIE by use of the SOG pattern as a mask, to form a columnar pattern 805B which had high aspect ratio columns at the positions previously occupied by PS in the former step (FIG. 10(*f*)).

On the obtained columnar pattern, aluminum was vapor-deposited in a thickness of 30 nm. Thereafter, the substrate was subjected to ashing treatment with $O_2$ plasma, and then immersed in water. The substrate in water was subjected to ultrasonic washing for lift-off treatment, so as to remove the columnar pattern. As a result, a first electrode 808 having desired openings was formed on the photoelectric conversion layer.

The surface electrode formed by the above procedure had a thickness of 30 nm, an average opening area of $2.0\times10^3$ nm$^2$ (opening diameter: 50 nm) and an average aperture ratio of 52%. The transmittance of the produced aluminum nano-mesh electrode was measured at an incident light wavelength of 500 nm. As a result, it was found that the transmittance and the resistivity were about 50% and about 30 μΩ·cm, respectively.

With respect to the solar cell thus produced, the photoelectric conversion efficiency was evaluated in the same manner as in Example 1. As a result, the efficiency was found to be as high as 6.9%. Further, it was also verified that the effect of the embodiment was obtained even if the first electrode was made of metals other than aluminum.

Example 7

Manufacturing Process by Nano-Imprint

Figure 11:
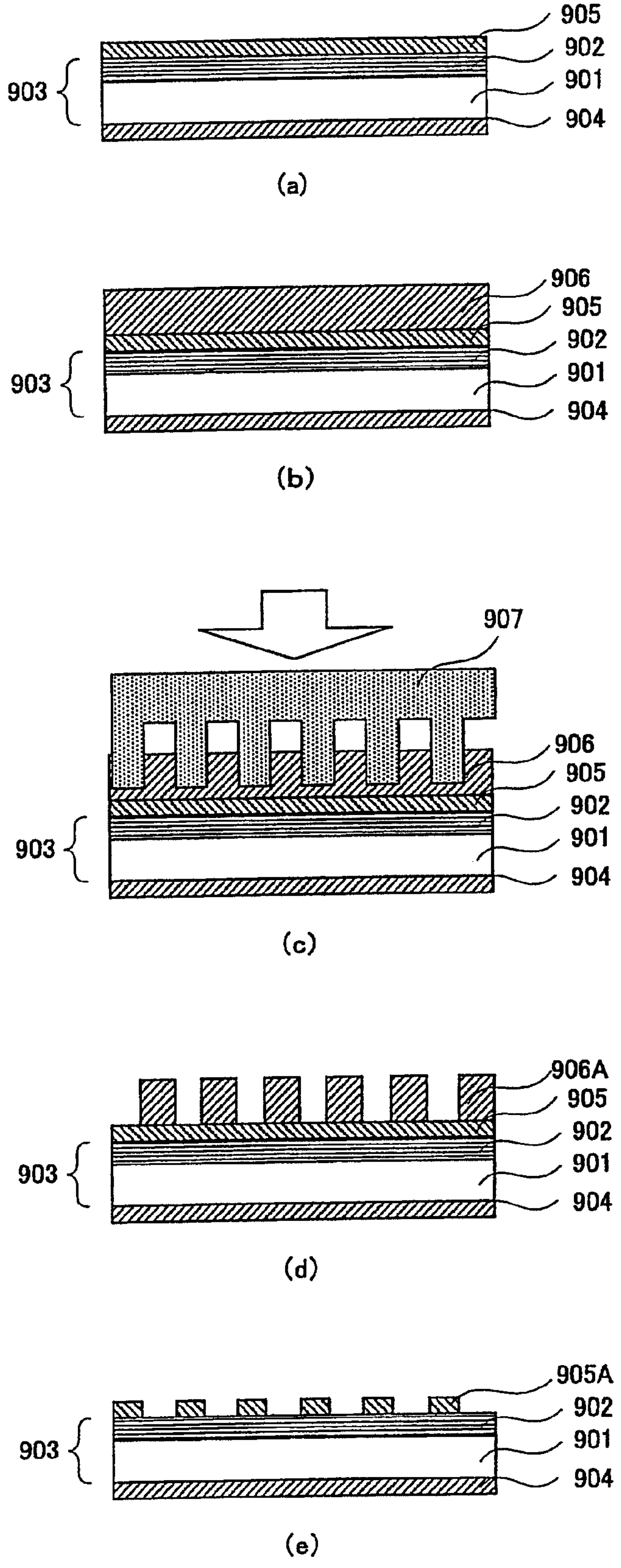
FIG. 11 shows schematic sectional views illustrating yet another process for manufacturing a solar cell according to one embodiment of the present invention.

By referring to FIG. 11, this example explains the manufacturing process of monocrystalline Si type solar cell equipped with an electrode having fine openings formed according to a nano-imprint method. The photoelectric conversion layer of monocrystalline Si was formed in the same manner as in Example 1.

First, an $n^+$ layer 902 was formed on one surface of a p-type silicon substrate 901 in the same manner as in Example 1, to produce a photoelectric conversion layer 903. After that, Au/Zn was vapor-deposited in vacuum to form a second electrode layer 904 on the p-type layer of the photoelectric conversion layer. On the $n^+$ layer of the photoelectric conversion layer 903, aluminum is vapor-deposited in vacuum to form a thin metal layer 905 having 50 nm thickness (FIG. 11(*a*)).

Independently, an i-line positive thermosetting resist (THMR IP3250 [trademark], manufactured by Tokyo Ohka Kogyou Co., Ltd.) was diluted with ethyl lactate by 1:2, to prepare a resist composition. The resist composition was spin-coated on the thin metal layer 905 at 3000 rpm for 35 seconds, and then heated at 110° C. for 90 seconds on a hot-plate to undergo thermosetting reaction and thereby to form a resist layer 906 (FIG. 11(*b*)). The resist layer had a thickness of about 150 nm.

Subsequently, a fine relief pattern corresponding to the openings proposed by the embodiment is transferred onto the resist layer 906 by use of a stamper 907 as a mold.

In this example, a quartz plate was subjected to an electron beam lithographic process to prepare a stamper having a surface structure in which holes of 120 nm depth and 130 nm diameter were aligned in a closest packing arrangement of 200 nm period.

In the process for manufacturing a solar cell according to the embodiment, there is no particular restriction on the materials of the stamper and on how to make the fine relief structure on the stamper surface. For example, the stamper can be formed according to the above-described method employing fine particles or block copolymer.

The stamper was then subjected to release treatment. The surface of the stamper was coated with a fluorine-type release agent such as perfluoropolyether so that the stamper might have such a low surface energy as to improve the releasability.

Thereafter, the stamper was pressed onto the above-described resist layer by means of a heater plate press (N4005-00 type [trademark], manufactured by NPa SYSTEM Co., Ltd.) at a temperature of 128° C. under 60 kN, and then gradually cooled for 1 hour to room temperature. After that, the stamper was vertically released therefrom, so that a pattern in reverse to the relief pattern of the stamper was transferred on the resist layer (FIG. 11(*c*)). Thus, the procedure gave a periodical opening resist pattern having periodically arranged columns 906A of 130 nm diameter (FIG. 11(*d*)).

The embodiment is not restricted to the thermal nano-imprinting process described above. Various imprinting techniques such as photo imprint and soft imprint can be used to form the above pattern, and they by no mean impair the functions of the solar cell according to the embodiment.

The above aluminum layer was etched through the formed resist pattern as an etching mask by means of ICP-RIE system (manufactured by SAMCO Inc.). In the same manner as in Example 1, the aluminum layer was first subjected to sputter-etching for 1 minute under the conditions of Ar: 25 sccm, 5 mTorr, an ICP power of 50 W and a Biass power of 150 W to remove $Al_2O_3$, and was successively etched for 80 seconds under the conditions of $Cl_2$/Ar mixed gas: 2.5/25 sccm, 5 mTorr, an ICP power of 50 W and a Biass power of 150 W.

The above procedure gave a first electrode 905A of aluminum nano-mesh structure having a thickness of 50 nm, an average opening area of $1.3\times10^{-2}$ $\mu m^{-2}$ (opening diameter: 130 nm) and an average aperture ratio of 35.4%. The transmittance of the produced first electrode was measured at an incident light wavelength of 500 nm. As a result, it was found that the transmittance and the resistivity were about 47% and about 30 μΩ·cm, respectively.

With respect to the solar cell thus produced, the photoelectric conversion efficiency was evaluated in the same manner as in Example 1. As a result, the conversion efficiency was found to be as high as 6.4%. Further, it was also verified that the effect of the embodiment was obtained even if the first electrode was made of metals other than aluminum.

Needless to say, the above examples by no means restrict the embodiment and various modifications may be made and applied.

Specifically, the embodiment is not limited to the specific details of the above examples, and the constituting elements of the embodiment can be variously modified and used in practice unless they depart from the spirit or scope of the general inventive concept. The constituting elements disclosed in the above examples may be properly combined to form various embodiments. For example, it is possible to omit some of the elements described in the examples. Further, the elements of different embodiments may be properly combined.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the sprit of the inventions. The accompanying claims and their equivalents are intended to cover such forms or modifications as would fail within the scope and sprit of the invention.

The invention claimed is:

1. A process for manufacturing a solar cell including a photoelectric conversion layer containing at least a p-type semiconductor and an n-type semiconductor, a first electrode layer made of metal and formed on a light incident side surface of said photoelectric conversion layer, and a second electrode layer formed on a surface opposite to said light incident side surface; wherein said first electrode layer has a thickness in the range of 10 nm to 200 nm, said first electrode layer has plural penetrating openings each of which occupies an area in the range of 80 $nm^2$ to 0.8 $\mu m^2$, an average distance between adjacent openings is in the range of 30 nm to 100 nm, and an aperture ratio, which is a ratio of the total area of said openings based on the total area of said first electrode layer, is in the range of 10% to 66%, said process comprising the steps of:

forming the photoelectric conversion layer, forming the first electrode layer directly on the light incident side surface of said photoelectric conversion layer, and forming the second electrode layer on the side opposite to the light incident side surface of said photoelectric conversion layer; wherein said step of forming the first electrode layer comprises the sub-steps of forming a thin metal layer, preparing a stamper whose surface has a fine relief pattern corresponding to the shape of the first electrode layer intended to be formed, transferring a resist pattern onto at least a part of said thin metal layer by use of said stamper, and etching said thin metal layer by use of said resist pattern as an etching mask, to form the first electrode layer having fine openings.

2. The process according to claim 1, wherein said stamper is produced by use of electron beam exposure.

3. The process according to claim 1, wherein said stamper is produced by:

coating a block copolymer-containing composition on at least a part of a stamper precursor, to form a block copolymer layer, causing phase separation of said block copolymer, to form microdomains in a dot pattern, and etching said stamper by use of said dot pattern of microdomains as an etching mask, to form the stamper whose surface has a fine relief pattern corresponding to the shape of the first electrode layer intended to be formed.

4. The process according to claim 1, wherein said stamper is produced by:

coating a resist composition on at least a part of a stamper precursor, to form a resist layer, forming a single particle layer of fine particles on the surface of said resist layer, etching said stamper by use of said single particle layer of fine particles pattern mask as an etching mask, to form the stamper whose surface has a fine relief pattern corresponding to the shape of the first electrode layer intended to be formed.

5. The process according to claim 1, wherein said stamper is produced by:

coating a resist composition on at least a part of a stamper precursor, to form a resist layer, forming a single particle layer of fine particles on the surface of said resist layer, etching said resist layer by use of said single particle layer as an etching mask, to form a resist pattern, filling openings in said resist pattern with inorganic substance, to form a reverse pattern mask, and etching said stamper by use of said reverse pattern mask as an etching mask, to form the stamper whose surface has a fine relief pattern corresponding to the shape of the first electrode layer intended to be formed.

6. The process according to claim 1, wherein said photoelectric conversion layer comprises a depletion layer at least partly positioned within a distance of 1 μm from the interface between said first electrode layer and said photoelectric conversion layer.

7. The process according to claim 1, wherein said first electrode layer is made of at least one metal selected from the group consisting of aluminum, silver, gold, platinum, nickel, cobalt, chromium, copper and titanium.

* * * * *